United States Patent [19]

Davies

[11] 4,246,611
[45] Jan. 20, 1981

[54] DIGITAL CONTROL SYSTEM AND A METHOD OF TRANSMITTING CONTROL DATA IN SUCH A SYSTEM

[75] Inventor: Colin J. Davies, Olney, England

[73] Assignee: Texas Instruments Incorporated, Dallas, Tex.

[21] Appl. No.: 914,109

[22] Filed: Jun. 9, 1978

[30] Foreign Application Priority Data

Jun. 21, 1977 [GB] United Kingdom ............... 25831/77

[51] Int. Cl.³ .............................................. H04B 9/00
[52] U.S. Cl. .................................... 358/194.1; 370/4; 370/29; 370/101
[58] Field of Search ........................ 358/194; 250/199; 343/178; 179/15 BS; 178/69.1

[56] References Cited

U.S. PATENT DOCUMENTS

| 4,045,613 | 8/1977 | Walker | 179/15 AF |
| 4,048,440 | 9/1977 | Peck | 179/15 AF |
| 4,063,041 | 12/1977 | Vollnhals | 179/15 BV |
| 4,091,272 | 5/1978 | Richter | 358/194 |

*Primary Examiner*—David L. Stewart
*Attorney, Agent, or Firm*—Melvin Sharp; N. Rhys Merrett; Gary C. Honeycutt

[57] ABSTRACT

TV low cost remote control system using a microprocessor decoder. Control data is transmitted in digitally encoded form and comprises blocks of eight bits of data separated by gaps in transmission of equivalent length. Each data block consists of a start bit followed by seven bits of data for channel identification. Data is presented to the microprocessor on one input line which it samples regularly as a part of its main keyboard scan routine and in response to a start bit checks the data bits and gaps to determine presence of a valid command. The remote control information is decoded directly by the microprocessor. Using seven identification bits, a channel capacity of 128 channels is possible.

34 Claims, 4 Drawing Figures

DIGITAL CONTROL SYSTEM AND A METHOD OF TRANSMITTING CONTROL DATA IN SUCH A SYSTEM

This invention relates to a digital control system and a method of transmitting control data. The invention particularly includes but is not exclusively limited to such a system in which inputs are transmitted from a remote input means to a digital control apparatus which includes a microprocessor. The transmission of data may be performed by means of a modulated light beam, for example.

A number of proposals have been made for the remote control of television receivers to enable a viewer to remain seated while adjusting, for example, the channel to which the receiver is tuned or its volume or the brightness of the picture. One such system is described by W. W. Evans, K. R. Wooling, J. B. George, B. W. Beyers, Direct Address Television Tuning and Display System Using Digital MOS Large Scale Integration, I.E.E.E. Trans. Consum. Electron., November 1976, Vol CD-22, No. 4, pp 287-288. It is an object to provide a digital control system suitable for controlling a television receiver but not limited to such an application.

According to one aspect of the present invention there is provided a digital control system having signal input means and control apparatus in which a single input from the input means is transmitted to the control apparatus by repetitions of a group of serial data bits identifying the particular input, each group being preceded by a predetermined start signal and followed by a gap of predetermined duration, the repetitions being continued for a period of time for which the single input is required to be applied to the control apparatus.

According to another aspect of the present invention there is provided a method of transmitting control data from an input means to a control apparatus comprising producing a group of serial data bits representing a particular control input to the control apparatus, forming a predetermined start signal and for the duration of the control data repeatedly reproducing the start signal and a group of data bits, each repetition of the start signal preceding a repetition a group of data bits, there being a predetermined time interval between the end of a repetition of the group of the data bits and the next repetition of the start signal.

In one embodiment the repetitions of the start signal and the group of data bits are separated by the predetermined time interval in which no signal is sent to the control apparatus from the input means, or such signal as is sent is a reference signal representing, for example, a binary 0.

The start signal may be a single pulse or other signal representing a binary 1 and a signal level or other signal representing binary 0 may be maintained throughout the gap.

The input means may include a manually operable keyboard and the group of data bits may represent the key of the keyboard which is being pressed at the time. The duration for which the key is pressed may determine the duration for which the repetitions of the start signal and the group of data bits continue. A digital counter may be used to scan the keyboard and an output from the keyboard used to record the output from the counter at the time as part at least of the group of data bits.

In one embodiment of the invention each group of data bits includes seven bits and each gap has a duration equivalent to that of eight bits, the start signal being a single binary 1.

The control apparatus may include a microprocessor programmed to execute a selected one of a plurality of different control functions in response to the group of data bits which it receives. If the control function is progressive, such as for example, the control of volume or brightness of a television receiver, the microprocessor may be programmed to increment a value representing a parameter of the particular function on each occurrence of the group of data bits allocated to that function. Such control may take the form of a steady increase from a minimum value to a maximum value followed by a resetting to the minimum value. Alternatively the parameter may increase steadily from a minimum value to a maximum value and then decrease at the same rate to a minimum value with successive occurrences of the appropriate group of data bits. Each group of data bits incoming to the control apparatus may be compared with the immediately preceding group and acted upon only if the groups are identical to one another; such a check will avoid spurious variation in control function parameters arising due to noise.

The control apparatus may be arranged to control a television receiver, and different groups of data may represent an increase or decrease in loudness, brightness, tuning frequency or band number. Color saturation and hue could also be controlled in the same way. The input means may be a remote control unit arranged to communicate with the control apparatus via an infrared light beam, for example, which is modulated by the start bit and group of data bits.

The invention could also be applied to the control of other equipment and is of particular advantage where the control apparatus includes a microprocessor. The invention is of value in control systems where the control channel must of necessity carry data at a relatively low rate.

In order that the invention may be fully understood and readily carried into effect, it will now be described with reference to the accompanying drawings, of which:

Figure 1:
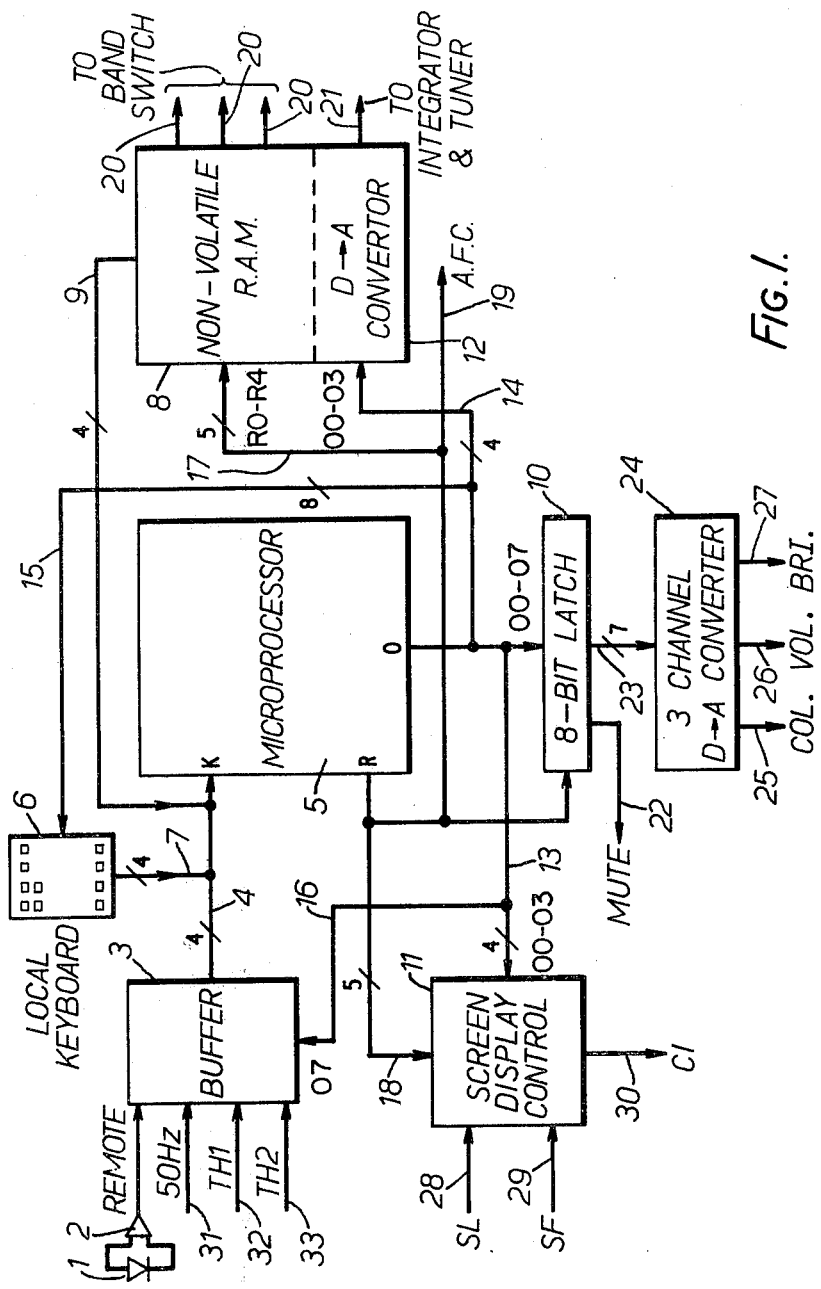
FIG. 1 is a block diagram of one example of control apparatus for a system in accordance with the present invention arranged for controlling a television receiver.
Figure 4:
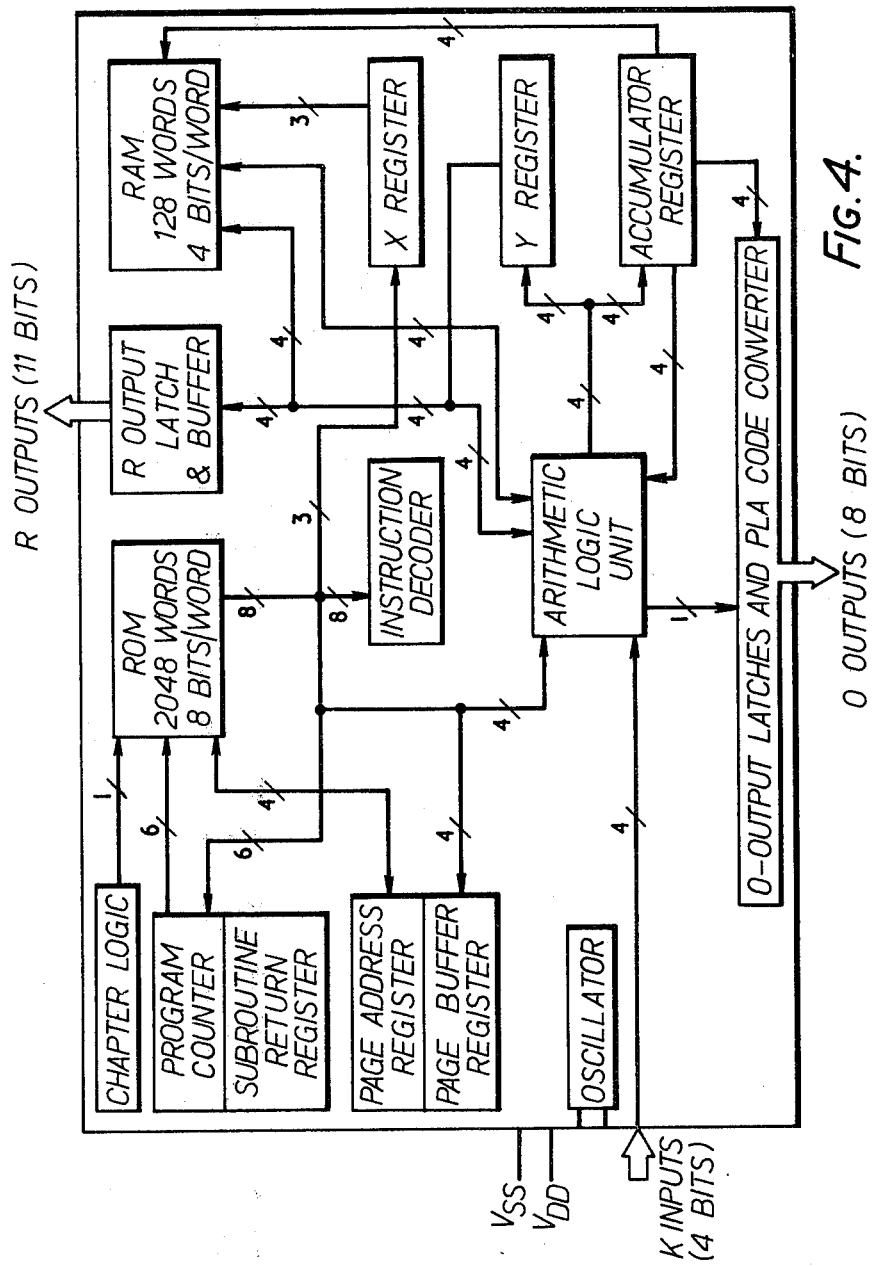
FIG. 4 shows a suitable logic block organization of the microprocessor forming part of FIG. 1.

In the control apparatus shown in FIG. 1, the signals transmitted from signal input means are modulated on a light beam, for example an infra-red light beam, which impinges on a light sensitive diode 1 from which an output signal is derived which after amplification in an amplifier 2 is applied to a buffer 3. The signals from the buffer 3 are applied over a four-wire channel 4 to the K inputs of a microprocessor 5. The microprocessor 5 may be of the type known as Texas Instruments type TMS 1100, described, for example, in TMS 1000 series Data Manual, MOS/LSI One-Chip Microcomputers, the Engineering Staff of Texas Instruments Incorporated, Semiconductor Group, December 1976. The logic block organization of the TMS 1100 is shown in FIG. 4. Also applied to the input terminals A of the microprocessor 5 are outputs from a local keyboard 6 which are connected via a channel 7, and outputs from a non-volatile random access memory 8 which are applied over a channel 9. The microprocessor 5 has two sets of output terminals respectively known as O terminals and R terminals. There are eight O terminals and eleven R terminals. All eight of the O terminals are connected to the inputs of an 8-bit latch 10 and O terminals 0 to 3 are connected respectively to a screen display control unit 11 for the cathode ray tube of the television receiver and to a digital to analogue converter 12 respectively over channels 13 and 14. All eight O channels are also connected via an eight-wire channel 15 as inputs for scanning the local keyboard 6. The terminal 07 is connected to control the buffer 3 via a conductor 16. Of the eleven R output terminals the terminals R0 to R4 are connected via a channel 17 to inputs of the RAM 8. Five other of the R output terminals are connected to the screen display control unit 11 via a channel 18 and others of the R terminals are connected as a control input to the eight-bit latch 10 and to provide a signal on a conductor 19 for controlling an automatic frequency control circuit of the television receiver. The RAM 8 has three outputs 20 for controlling a band switch of the receiver. The digital to analogue converter 12 has a single output on a conductor 21 which is connected to an integrator for applying a variable control voltage to a variable capacity diode to effect the tuning of the receiver. The 8-bit latch 10 has a single output on a conductor 22 which is used to mute the audio output of the receiver and a seven-wire channel 23 which is connected to an input of a three channel digital to analogue converter 24 having outputs 25, 26 and 27 respectively for controlling the color saturation of the picture, the volume of the reproduced sound and the birghtness of the picture. The unit 24 may be a Texas Instruments integrated circuit TMS 3701. The screen display control unit 11 receives the line and field scan signals over conductors 28 and 29 and produces an output on a conductor 30.

Figure 2:
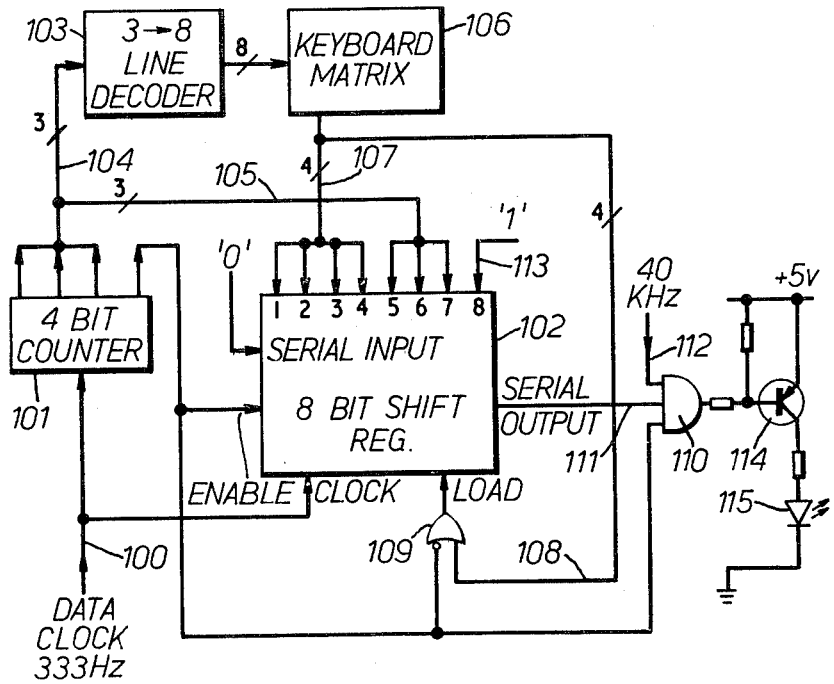
FIG. 2 is a block diagram of a signal input means suitable for use in conjunction with the control apparatus of FIG. 1 which may have the form of a remote control unit with a television receiver.

In addition to the outputs from the amplifier 2, the buffer 3 has three other inputs; a 50 Hz signal used for timing purposes applied via a conductor 31 and two signals TH1 and TH2 derived from threshold circuits during tuning of the receiver which are applied via conductors 32 and 33. The signal input means shown in FIG. 2 is a remote control unit suitable for controlling a television receiver having the control apparatus shown in FIG. 1. A 333 Hz data clock signal is applied via a conductor 100 to an input of a 4-bit counter 101 and to the clock input of an 8-bit shifting register 102. The outputs of the three stages of lower significance of the counter 101 are connected in parallel to the inputs of a three to eight line decoder 103 via a channel 104 and to stages 5, 6 and 7 of the shifting register 102 via a channel 105. The eight outputs of the decoder 103 are connected to the row conductors of a keyboard matrix 106 respectively, which matrix has four column conductors which are connected in parallel to stages 1, 2, 3 and 4 respectively of the shifting register 102 via a channel 107. The column conductors of the matrix 106 are also connected via a channel 108 to inputs of an OR-gate 109, the output of which is connected to a load input of the shifting register 102. The stage of greatest significance of the counter 101 is connected to an enable input of the shifting register 102, to an inhibit input of the gate 109, and to an input of an AND-gate 110. The gate 110 has two other inputs one of which is connected to receive the serial output from the shifting register 102 via a conductor 111 and the other of which is connected to receiver a 40 kHz carrier signal applied via a conductor 112. The eighth stage of the register 102 receives a permanent 1 input in the form of a voltage level representing binary 1 which is applied via a conductor 113. The output of the gate 110 is connected to a transistor amplifier 114, the output of which is used to power a light emitting diode 115 which produces a modulated infra-red light beam by which the input means communicates with the control apparatus of FIG. 1, the light beam being received by the light sensitive diode 1.

Figure 3:
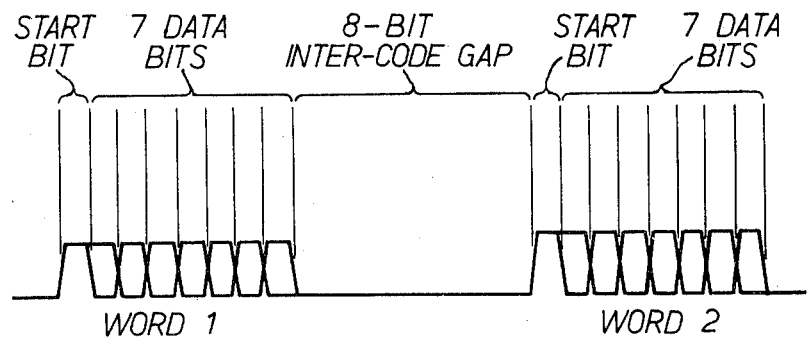
FIG. 3 is the diagram showing the form of signal transmitted from the signal input means to the control apparatus in the system shown in FIGS. 1 and 2.

The form of signal produced by the light emitting diode 115 takes the form shown in FIG. 3 and has a start bit preceding a 7 bit group of data bits after which there is an 8-bit intercode gap followed by another start bit and another group of seven data bits, and so on. The group of data bits remains the same for successive words as long as the same key of the keyboard 106 is pressed. The bit rate of the signal is 333 Hz, which means that as each word and its following gap occupy 16 bit periods, the words are repeated just over twenty times per second.

In FIG. 2 the data clock which has frequency of 333 Hz is applied via the conductor 100 to the 4-bit counter 101, so that the counter is incremented with each clock pulse, the counting being arranged to start from 0000 and being incremented by unit steps to 1111 when it is automatically reset to 0000 and the counting continues. The three stages of lower significance of the counter 101 are connected to the decoder 103, so that the eight output lines of the decoder 103 are energized successively as the total in the counter 101 is incremented. The matrix 106 which consists of eight row conductors and four column conductors with keys each effective to connect a row to a column conductor, receives the pulses from the decoder 103 and transmits one pulse in every 16 clock pulses down one of the row conductors depending on which of the keys is pressed at the time. The pulse is applied via the channel 107 to one of the stages 1 to 4 of the shifting register 102. It will be apparent therefore that when a key of the matrix 106 is pressed a pulse is applied twenty times a second to one of the inputs 1 to 4 of the register 102, the other three of those inputs receiving no pulse at this time. When a pulse appears on any one of the column conductors of the matrix 106, the gate 109 produces an output which causes the register 102 to load a 1 into the one of the stages 1 to 4, to which a pulse is applied from the matrix 106, and at the same time loads into stages 5, 6 and 7 the output of the counter 101 at that time. When the loading operation is completed, the 7-bit word stored in the first seven stages of the register 102 identifies the key of the matrix 106 which is being pressed at the time, the one of the stages 1 to 4 storing a 1 identifying the column in which the key lines, and the three digits in the stages 5, 6 and 7 identifying the row in which the key lies. Also in response to the load pulse from the gate 109, the register 102 stores in the eighth stage a binary 1 in response to the voltage level applied via the conductor 113. After the load pulse the 8-bits stored in the register 102 are clocked out by the clock pulses, the data appearing in serial form with the 1 from the eighth stage of the register 102 forming the start bit of the word. The fourth stage of the counter 101 produces an output during the ninth to sixteenth clock pulses of every group of 16 clock pulses applied to the counter 101, which output enables the register 102 to respond to the clock pulses to shift out the data stored in the register. The signal also inhibits the operation of the gate 109 so that the loading of the shifting register 102 occurs during one group of 8 clock pulses and the shifting out of the data occurs during the next group of 8 clock pulses. Furthermore, the signal from the fourth stage of the counter 101 also enables the AND gate 110 to transmit the serial data output from the register 102 and modulates it on a 40 kHz carrier applied via conductor 112. It will be apparent therefore that the diode 115 receives data of the form shown in FIG. 3 modulates on a 40 kHz carrier which is transmitted to the control apparatus shown in FIG. 1.

The control apparatus of FIG. 1 receives the modulated light beam from the light emitting diode 115 of FIG. 2 on the photosensitive diode 1. A voltage corresponding to the output of the gate 110 of FIG. 2 is therefore produced by the diode 1 and is amplified by the amplifier 2 and applied to the buffer 3. The microprocessor 5 compares the data word received by the buffer 3 with a data word it has received previously and only if they are the same does it take any further action. The problem of synchronization of the input data word is dealt with by recording eight bits after an 8-bit gap, and the microprocessor 5 is arranged to check that all eight logic 0's are present in each gap. The input signals received from the amplifier 2 are sampled regularly as part of the main scan routine of the microprocessor, and when a logic 1 is detected at the output of the amplifier 2 the microprocessor 5 changes from the normal scan routine in which the keyboard 6 is scanned and samples the output of the amplifier 2 again after approximately half the width of a data pulse. If the output of the amplifier 2 at this time is logic 0, the microprocessor 5 rejects the data as being noise or grossly mistimed and returns to the normal keyboard scan. However, if the input remains at logic 1, it assumes that logic 1 is a start pulse and the following seven bits are stored. The microprocessor 5 then checks that the eight bits following the stored seven bits are all zero, corresponding to the gap between data words; if they are not, the processor returns the main keyboard scan, the data having been rejected as mistimed. If however, the gap is of the correct length, that is to say all eight logic 0's are present then the processor switches to a fast sampling mode. The seventeenth bit, that is to say, the first bit of the next data word, is of course a logic 1 and is used for resynchronizing the sampling of the data received from the amplifier 2, so that closely controlled accuracy timing of the data from the input means is not necessary provided that it is sufficiently well controlled for the eight logic 0's of the gap between data words to be correctly identified. Each data word received is stored and checked against the immediately preceding data word, and if they are different, no further action is taken as mentioned above. If, however, the data words are the same, the transmission is considered to be valid and the microprocessor decodes the data word and performs the operation instructed by it.

The local keyboard 6, which is of the same form as the keyboard matrix 106 of FIG. 2 and has eight rows each of four keys, receives scanning pulses over the channel 15 which has eight conductors and produces outputs on channel 7 in accordance with any key of the keyboard 6 which is pressed, which outputs are applied to the four K inputs of the microprocessor 5. The keyboard 6 enables the microprocessor 5 to be used for controlling the television receiver in the same way as the keyboard matrix 106 enables the remote control of the receiver to be effected.

Programming of the microprocessor 5 to perform the operations instructed by the data words incoming on the inputs K will not be described because this will depend on the precise organization of microprocessor 5. Fully detailed programming information for the TMS 1100 microprocessor is contained in the TMS 1000 Series Programmers Reference Manual or the TMS 1000 Series Software Users Guide, both published 1975 by Texas Instruments Incorporated. The operations which the microprocessor 5 performs will be described in detail to show how the various controls of the television receiver may be effected, the particular programming of the microprocessor only being incidentally relevant to the invention and readily carried out on the basis of the programming information as identified above.

The tuning of the television receiver is assumed to involve three aspects, firstly switching from one band to another, secondly tuning within a band and thirdly automatic frequency control which must be inhibited during the tuning within a band so that the automatic frequency control does not oppose a change of channel.

The outputs from the microprocessor 5 which define the channel to which the receiver is to be tuned appear on conductors 00 to 03 which form the channel 14, and these are applied to the unit consisting of the RAM 8 and the digital to analog converter 12. Control signals for the RAM 8 are applied to it over the channel 17 which is connected to outputs R0 to R4 of the microprocessor 5. The controls include instructions for the RAM to read an address specified on the channel 14 or to write into that address, to produce outputs on the conductors 20 for controlling semiconductor switches for effecting a required band change and for multiplexing the data being applied to the RAM 8 via the channel 14 so that 16-bit words can be used to specify frequencies to which the receiver is to be tuned, although these words appear as four consecutive 4-bit words on the channel 14. Assuming that the receiver has been switched to the correct band by the outputs on the conductors 20, the microprocessor 5 then causes a 12-bit word to be applied to the digital to analog converter from the RAM 8 to tune the receiver to the correct channel within the band. The converter 12 produces as an output on the conductor 21 a pulse width modulated signal which when integrated causes a d.c. voltage representing the channel frequency to to generated, which voltage would be applied to the varicap diode to effect the tuning. During this tuning operation the microprocessor 5 produces an output on the conductor 19 which serves to block the action of the automatic frequency control of the receiver until the tuning operation has been completed when the automatic frequency control is allowed to become effective again and hold the receiver tuned to the selected channel.

The rate at which the frequency to which the receiver is tuned is controlled in response to a 50 Hz signal applied to the buffer 3 via the conductor 31. Thresholds 1 and 2 are provided effective just below and just above a selected frequency to which the receiver is to be tuned, so that as the tuning approaches the selected frequency a signal is produced when the threshold is reached which is applied via the conductor 32 or the conductor 33, depending on the direction of tuning, which signal is applied to the buffer to slow down the rate of change of frequency of the tuning circuit to ensure more accurate tuning.

Control of the color saturation, volume and brightness of the receiver is effected by the outputs of the three-channel digital to analog converter 24 which receives its inputs via the seven-wire channel 23 from an 8-bit latch 10. When an adjustment of one of these parameters is required the microprocessor 5 produces an output on one of the R outputs which causes the latch 10 to record the eight 0 outputs occurring at the time. All but one of these eight outputs are at logic 0 and one of them is at logic 1 specifying the change required. The eight bits when a logic 1 instruct the following changes to occur: color saturation increase, color saturation decrease, sound volume increase, sound volume decrease, picture brightness increase, picture brightness decrease, reset color saturation, sound volume and picture brightness to intermediate datum levels, and mute the sound output. Each of these eight instructions corresponds respectively to one of eight of the buttons of the keyboard 6 and the keyboard matrix 106 of FIG. 2.

Suppose that the viewer wishes to increase the sound volume of the receiver. He pushes the appropriate key of the keyboard 6 or the keyboard matrix 106, which causes the microprocessor 5 to produce an output on the corresponding one of the O outputs which causes the voltage output on the conductor 26 to be incremented. As long as the key remains pressed the output will continue to be incremented at a suitable rate, so that the viewer can obtain the volume he requires. The converters include respective counters, the totals in which are incremented or decremented for a period determined by the microprocessor 5 so that a suitable graduation of control is required when a key instructing a change to one of the parameters is pressed. Should the viewer require to mute the output of the receiver, for example, because a telephone call is received, then he can press a key on the keyboard 6 or keyboard matrix 106 which mutes the output of the receiver, a second pressing of the key or the pressing of another key may be arranged to restore the sound output.

Although it would be possible to enable the direct selection of a channel to which the receiver is to be tuned by pressing a single key of the keyboard 6 or the keyboard matrix 106, it may be desirable to provide keys for selecting a signal frequency increase or a signal frequency decrease to enable a desired channel to be selected. In either case, it is desirable for the viewer to have a ready note of the channel to which the receiver is tuned or possibly the signal frequency and this is provided by the screen display control unit 11 which produces an output on the conductor which is applied to the cathode of the cathode-ray tube to cause the generation of alphanumeric characters identifying the channel, which characters could conveniently be located in any suitable region of the screen. The techniques required for producing such characters are well known from TELETEXT apparatus and will not be described further. Another facility which could be provided by the control unit 11 is a display of the time of day which could be effected by causing the microprocessor 5 to count pulses from the 50 Hz input on the conductor 31 and generate the appropriate characters which could be displayed under the channel number, for example.

It will be apparent that in the control apparatus, the remote control information from the input means shown in FIG. 2 is decoded directly by the microprocessor. The remote control or data transmission system described enables 128 channels of control to be provided with only seven bits of data, and this can obviously be increased or decreased to suit different applications by selection of longer or shorter data words. The 40 kHz carrier signal does not need to be stable or accurately tuned since it does not define a control channel. The circuitry of the input means is very simple and does not require a highly stable clock to provide reliable data transmission to the control apparatus, because provided that the data clock frequency is within three percent of the sampling rate of the microprocessor, the digits will be sufficiently accurately defined for the 8-bit gap between data words to be identified correctly. The resynchronization at the start of each data word means that long term stability for synchronization is not required.

Although the invention has been described with reference to a specific embodiment in which a television receiver is controlled, it will be appreciated that the invention could equally well be applied to the control of many other types of apparatus, for example, a chemical or mechanical manufacturing process, telemetry, and virtually any remote control application.

What we claim is:

1. A digital control system having control apparatus for providing output control signals in response to signals generated by signal input means, and means operatively coupling the signal input means with said control apparatus and responsive to a single input from the signal input means to generate a group of serial data bits occupying a predetermined number of equal bit periods and comprising an initial predetermined start signal followed by serial data bits identifying that particular input and to transmit to the control apparatus a predetermined number of repetitions of said serial data bit group separated by constant signal level gaps occupying a predetermined series of equal bit periods providing means for verification of valid timing of the group of serial data bits; and said control apparatus including microprocessor means for checking said gaps to verify valid timing of said groups of serial data bits and responsive to a plurality of validly timed identical groups of serial data bits to generate a corresponding decoded digital output signal.

2. A system according to claim 1, in which the predetermined start signal corresponds to a binary 1.

3. A digital control system according to claim 1 or claim 2, wherein said groups of data bits are separated by gaps each defined by a predetermined series of binary 0 signal levels.

4. A system according to claim 1, wherein said gaps each has a duration equal to that of one of said groups of serial data bits.

5. Digital control system including microprocessor means for providing output signals in response to signals generated by signal input means including a keyboard matrix having m rows and n columns, generator means operatively coupled to the keyboard matrix and responsive to a single input corresponding to actuation of a key of said keyboard matrix to generate a group of serial data bits comprising an initial predetermined start signal followed by identifying data bits corresponding to that particular input, said identifying data bits comprising a data bit in one of n identifying data bit positions designating the matrix column associated with the activated key and the remaining identifying data bits providing coded identification of the matrix row associated with the activated key, and means coupling said generator means to said microprocessor means for transmitting thereto repetitions of said serial data bit groups separated by gaps of predetermined duration for operation of said microprocessor means to produce an output signal.

6. Digital control system according to claim 5, wherein the keyboard matrix has 8 rows, and 4 columns and wherein three identification data bits are used to provide binary coded identification of the matrix row associated with an activated key, and wherein said start signal is a single data bit, and wherein said gaps of predetermined duration are occupied by a data bit different from the start signal data bit.

7. Digital control system according to claim 5, including accumulating means operatively coupled to said microprocessor means for response to recurring identification data bit groups associated with at least one of said matrix keys received by said procroprocessor means, for incrementing or decrementing the count of said accumulating means.

8. Digital control system according to claim 7, including digital to analog converter means for converting the count of said accumulating means into an increasing or decreasing analog signal.

9. Digital control system according to claim 5, wherein said generator means includes counter means clocked at a predetermined rate and operatively coupled to said keyboard matrix for scanning the matrix rows in response to the changing counts of said counter means; and means for detecting an output from a column of said matrix in response to said scanning when a key is actuated and for combining that output with the then existing digital count of the counter means to produce a said group of identification data bits.

10. Digital control system according to claim 5, wherein said coupling means comprises an electro-opto transmitter means and an optoelectrical receiver means.

11. Digital control system according to claim 10, wherein said transducers comprise semiconductor devices.

12. Digital control system including microprocessor means for providing output signals in response to signals generated by signal input means including a keyboard matrix having m rows and n columns, means operatively coupling the keyboard matrix and said microprocessor means and responsive to a single input corresponding to actuation of a key of said keyboard matrix to generate a group of serial data bits comprising an initial predetermined start signal bit followed by identifying data bits corresponding to that particular input, said identifying data bits comprising a data bit in one of n identifying data bit positions designating the matrix column associated the activated key and the remaining identifying data bits providing coded identification of the matrix row associated with the activated key, said coupling means operable to transmit to said microprocessor means repetitions of said serial data bit groups separated by gaps of predetermined duration with continuation of said repetitions for a predetermined period of time, and wherein said microprocessor means includes means for comparing each group of serial data bits received from said coupling means with the immediately preceding received group and for responding to produce an output signal only on identicality between said groups.

13. Digital control system according to claim 12, wherein said microprocessor means includes timing validity verification means for enabling response of said microprocessor means only to a group of serial data bits following a gap having a duration within a predetermined range of time.

14. Digital control system according to claim 12, wherein said start signal is a binary 1 signal level and said predetermined gaps are occupied by a signal level representing a binary 0.

15. Digital control system including microprocessor means for providing output signals in response to signals generated by signal input means including a keyboard matrix having m rows and n colums;
digital counter means clocked at a predetermined rate and having a set of outputs operatively coupled to said keyboard matrix for scanning the matrix rows in response to the changing count of said counter means;
shift register means having:
(a) at least one stage connected to receiver a digital start signal;
(b) n stages connected to the n respective matrix columns; and
(c) a set of stages connected to the respective outputs of said set of counter outputs coupled to said matrix rows;
means responsive to actuation of a key of said keyboard for loading into said shift register means:
(a) said digital start signal;
(b) a data bit transmitted from said counter via the matrix column associated with said activated key; and
(c) data bits from said set of counter outputs corresponding to the count of the counter means existing at the time of activation of said keyboard key and representing the coded identification of the matrix row associated with the activated key so that said shift register is loaded with a group of serial data bits comprising said row and column identification data bits preceded by said digital start signal;
and means for transmitting to said microprocessor means repetitions of said group of serial data bits from said shift register means separated by gaps of predetermined duration for operation of said microprocessor means to produce an output signal characteristic of the activated key of said keyboard matrix.

16. Digital control system according to claim 15, wherein said transmitting means comprises an electro-opto transmitter means; and an optoelectrical receiver means for inputting to said microprocessor means, signals received from said transmitting means.

17. Digital control system according to claim 16, wherein said transmitting means and said receiver means comprise semiconductor devices.

18. Digital control system according to claim 15, including signal translating means coupled to said microprocessor means for generating television broadcast receiver control signals in response to output signals from said microprocessor means.

19. Digital control system according to claim 18, including accumulating means operatively coupled to said microprocessor means for response to recurring identification data bit groups associated with at least one of said matrix keys received by said microprocessor means, for incrementing or decrementing the count of said accumulating means.

20. Digital control system according to claim 19, including digital to analog converter means for converting the count of said accumulating means into an increasing or decreasing analog signal.

21. Digital control system according to claim 20, wherein said digital-to-analog converter means provides at least one analog output representing color, volume or brightness control signals.

22. Digital control system according to claim 18, wherein said signal translating means outputs include at least one tuning control output.

23. A method of transmitting control data from an input means to a control apparatus including the steps of: producing a group of serial data bits including a set of identification bits occupying a predetermined number of equal bit periods for representing a particular control input to the control apparatus and preceded by a predetermined start signal, and for the duration of the control data repeatedly reproducing the start signal and the set of identification data bits, each repetition of the start signal preceding a repetition of said set of identification data bits, and providing between the end of a repetition of a set of the identification data bits and the next repetition of said start signal a gap defined by a predetermined series of equal bit periods occupied by identical signal levels for enabling verification by said control apparatus of valid timing of said groups of serial data bits, said gap having a duration equal to the combined duration of the set of identification data bits together with its start signal.

24. A method according to claim 23, wherein the predetermined start signal is a signal representing a single binary "1".

25. A method according to claim 23, wherein during each said gap there is maintained a data level representing binary "0".

26. A method according to claim 23, wherein each said gap is equal to the combined duration of the set of identification data bits together with its start signal.

27. A method according to claim 23, including the step of using a plurality of validly timed groups of said serial data bits to generate a corresponding decoded digital output signal.

28. A method according to claim 27, including the step of utilizing said decoded digital output signal to produce a television receiver function control signal.

29. A method according to claim 27, including the step of utilizing said decoded digital output signal to produce a television receiver function control signal that varies in an analog manner.

30. A digital control system having control apparatus including microprocessor means for providing output control signals in response to binary data signals generated by signal input means, and means operatively coupling the signal input means with said control apparatus and responsive to a single input from the signal inputs means to generate a group of serial data bits occupying a predetermined number of equal bit periods and comprising an initial predetermined start signal including a predetermined one of the binary signal levels in the first digit position followed by serial binary data bits identifying that particular input and to transmit to the control apparatus a predetermined number of repetitions of said serial data bit groups separated by gaps occupying a predetermined series of equal bit periods in which only the other binary signal level appears providing means for verification of valid timing of the group of serial data bits, said microprocessor means operable to check said gaps to verify valid timing of said groups of serial data bits and responsive to a plurality of validly timed identical groups of serial data bits to generate a corresponding decoded digital output signal.

31. A digital control system according to claim 30, wherein the start signal is a binary "1" signal level occupying the first digit position and wherein each gap is defined by a series of binary "0" signal levels.

32. A digital control system according to claim 30, further including means for storing said decoded output signals.

33. A digital control system according to claim 31, including means for receiving and utilizing said decoded output signals.

34. A digital control system according to claim 29, including means for accumulating a succession of identical decoded output signals and producing an analog output signal level that increases or decreases with said accumulation.

* * * * *